United States Patent [19]

Phillips

[11] Patent Number: 5,598,112
[45] Date of Patent: Jan. 28, 1997

[54] CIRCUIT FOR GENERATING A DEMAND-BASED GATED CLOCK

[75] Inventor: Christopher E. Phillips, San Jose, Calif.

[73] Assignee: National Semiconductor Corporation, Santa Clara, Calif.

[21] Appl. No.: 451,219

[22] Filed: May 26, 1995

[51] Int. Cl.$^6$ ............................................. H03K 19/096
[52] U.S. Cl. ............................................. 326/93; 326/39
[58] Field of Search ............................. 326/39, 41, 93, 326/96

[56] References Cited

U.S. PATENT DOCUMENTS

| | | | |
|---|---|---|---|
| 5,155,393 | 10/1992 | Gongwer et al. | 326/93 X |
| 5,189,319 | 2/1993 | Fung et al. | 307/452 |
| 5,204,953 | 4/1993 | Dixit | 395/400 |
| 5,254,888 | 10/1993 | Lee et al. | 307/480 |
| 5,259,006 | 11/1993 | Price et al. | 375/107 |
| 5,289,050 | 2/1994 | Ogasawara | 326/93 X |
| 5,302,866 | 4/1994 | Chiang et al. | 326/93 X |
| 5,315,181 | 5/1994 | Schowe | 326/93 |
| 5,391,942 | 2/1995 | El-Ayat et al. | 326/39 |
| 5,404,473 | 4/1995 | Papworth et al. | 395/375 |
| 5,408,626 | 4/1995 | Dixit | 395/400 |

OTHER PUBLICATIONS

L-T Wang et al., "Feedback Shift Registers For Self–Testing Circuits", *VLSI Systems Design*, Dec. 1986.

Masakazu Shoji, "CMOS Dynamic Gates", Chapter 5, *AT&T CMOS Digital Circuit Technology*, Prentice Hall, 1988, pp. 210–257.

Guthrie, Charles, "Power–on Sequencing For Liquid Crystal Displays; Why, When, And How", *Sharp Application Notes*, Sharp Corporation, 1994, pp. 2–1 thru 2–9.

Bernd Moeschen, "NS32SP160—Feature Communication Controller Architecture Specification", *National Semiconductor*, Rev. 1.0, May 13, 1993.

Agarwal, Rakesh K., *80x86 Architecture and Programming, vol. II: Architecture Reference*, Chapter 4, Prentice Hall, 1991, pp. 542–543.

Intel486 Microprocessor Family Programmer's Reference Manual, Intel Corporation, 1993.

"8237A High Performance Programmable DMA Controller (8237A, 8237A–4, 8237A–5)", *Peripheral Components*, Intel, 1992, pp. 3–14 thru 3–50.

Hennessy, John, et al., "Interpreting Memory Addresses", *Computer Architecture A Quantitative Approach*, pp. 95–97, Morgan Kaufmann Publishers, Inc. 1990.

*PowerPC601 Reference Manual*, IBM, 1994, Chapter 9, "System Interface Operation", pp. 9–15 thru 9–17.

Intel Corp., Microsoft Corp., *Advanced Power Management (APM) BIOS Interface Specification*, Revision 1.1, Sep. 1993.

*Primary Examiner*—David R. Hudspeth
*Attorney, Agent, or Firm*—Limbach & Limbach L.L.P.

[57] ABSTRACT

A demand-based clocking circuit generates a demand-based gated clock signal. A latch circuit data input receives an enable signal. A clock input receives a first periodic input clock signal. A latch circuit data output provides a shifted enable signal that transitions from an inactive logic state to an active logic state on the first transition of the first input clock signal from the first to the second logic state after the enable signal transitions from the inactive to the active logic state. The shifted enable signal transitions from the active to the inactive logic state on the first transition of the first input clock signal from the first to the second logic state after the enable signal transitions from the active to the inactive logic state. A logic circuit provides the gated clock signal such that the gated clock signal transitions from the inactive to the active logic state on the first transition of a second input clock signal from the first to the second logic state after the shifted enable signal transitions from the inactive to the active logic state, and that transitions from the active to the inactive logic state on the transition of the shifted enable signal from the active to the inactive logic state.

5 Claims, 1 Drawing Sheet

CIRCUIT FOR GENERATING A DEMAND-BASED GATED CLOCK

TECHNICAL FIELD OF THE INVENTION

The present invention relates to gated clock generation circuits and, in particular, to a demand-based gated clock generation circuit which provides robust clocking at high operating frequencies, even under severe skew conditions.

BACKGROUND OF THE INVENTION

Clocking of data into registers is well-known in the art. A conventional high-speed register implementation is illustrated in block form in FIG. 1. Referring to FIG. 1, a register 10 is connected to receive data, via a two-to-one data selector 12, in response to rising edge transitions of a system clock signal, CK1. The two-to-one data selector 12 selects between recirculated data 14, recirculated from the register 10, and externally provided data 16 in response to an enable signal, EN. In particular, when the enable signal, EN, is low, the recirculated data 14 is clocked into the register 10. When the enable signal, EN, is high, the externally supplied data 16 is clocked into the register 10.

It can be seen that the register 10 is clocked even when no data is being provided externally. Since it is not desired to change the contents of the register 10 when no data is being provided externally (and, in fact, the contents are not being changed), the register 10 is unnecessarily clocked in this situation, and power is unnecessarily consumed.

There have been attempts to implement "gated" register clocking circuits. With gated register clocking, a register is clocked only when it is desired to change the contents of the register. However, these circuits typically require strict control of set-up and hold times. Particularly in high frequency applications, clock skewing may cause violation of the strict set-up and hold time requirements.

SUMMARY OF THE INVENTION

The present invention is a demand-based clocking circuit for generating a demand-based gated clock signal.

A latch circuit (e.g., a D-type flip flop) has a data output, and a data input connected to receive an enable signal. The enable signal has an active logic state and an inactive logic state. A clock input is connected to receive a first input clock signal having periodic clock cycles. In each of the clock cycles, the first input clock signal has a first logic state during a first portion of the clock cycle and transitions to a second logic state during a second portion of the clock cycle. The data output is connected to provide a shifted enable signal that transitions from the inactive logic state to the active logic state on the first transition of the first input clock signal from the first to the second logic state after the enable signal transitions from the inactive to the active logic state, and that transitions from the active to the inactive logic state on the first transition of the first input clock signal from the first to the second logic state after the enable signal transitions from the active to the inactive logic state.

A logic circuit is responsive to the shifted enable signal and to a second input clock signal. The second input clock signal has periodic clock cycles. In each of the clock cycles, the second input clock signal has the second logic state during a first portion of the cycle and transitions to the first logic state during a second portion of the cycle. The logic circuit provides the gated clock signal such that the gated clock signal transitions from the inactive to the active logic state on the first transition of the second input clock signal from the first to the second logic state after the shifted enable signal transitions from the inactive to the active logic state, and that transitions from the active to the inactive logic state on the transition of the shifted enable signal from the active to the inactive logic state.

A better understanding of the features and advantages of the invention will be obtained by reference to the following detailed description and accompanying drawings which set forth an illustrative embodiment in which the principles of the invention are utilized.

DETAILED DESCRIPTION

Figure 1:
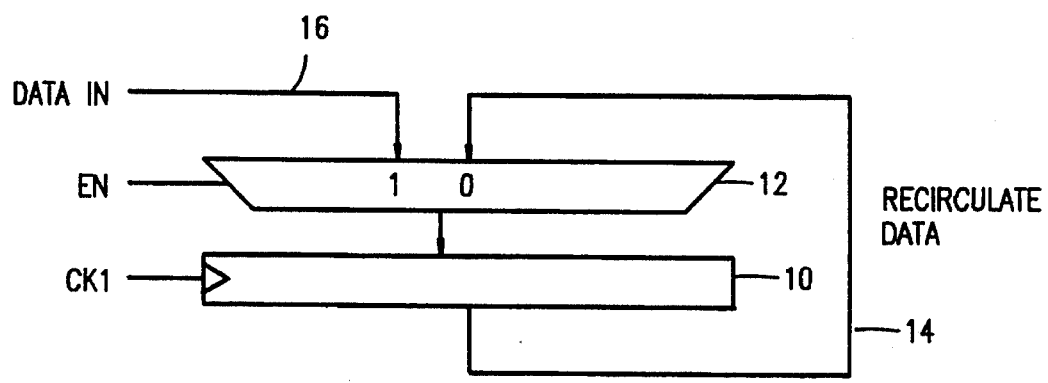
FIG. 1 is a block diagram illustrating a conventional high speed register clocking system.
Figure 2:
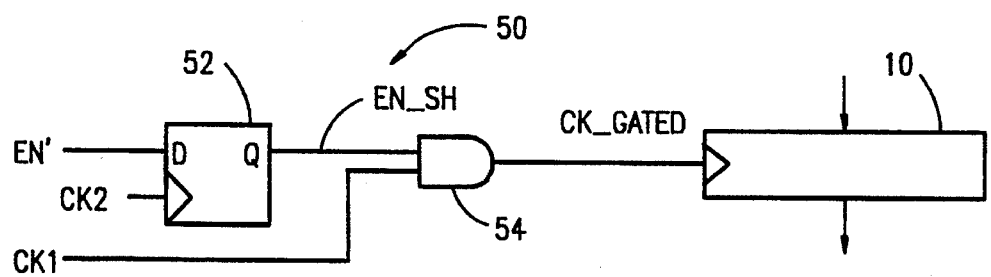
FIG. 2 is a block diagram illustrating a gated clock generation circuit in accordance with the present invention.
Figure 3:
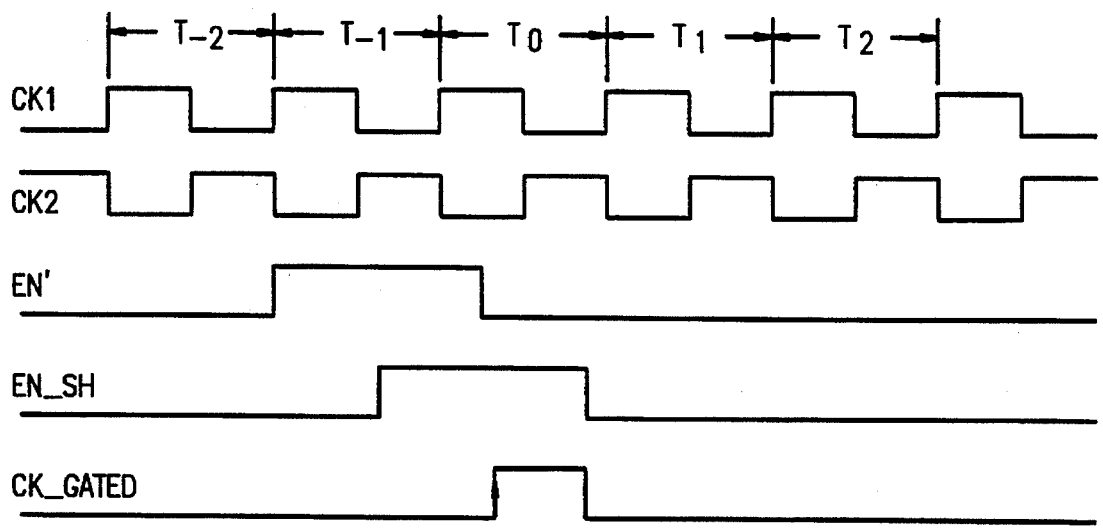
FIG. 3 is a timing diagram which illustrates the timing of signals which may be provided to, and created by, the circuit of FIG. 2.

FIG. 2 illustrates a circuit 50, in accordance with the present invention. The circuit 50 generates a gated clock, CLK_GATED, for clocking data into and/or out of the register 10. FIG. 3 illustrates the timing of the signals provided to, and created by, the circuit 50. It should be noted that the clock signal CK1, shown in FIG. 2 and the waveform of which is shown in FIG. 3, is the same signal as the signal similarly labelled in FIG. 1.

Referring now to FIG. 2, a latch 52 receives an enable signal EN' at the data input of the latch 52. Referring to FIG. 3, if it is desired to transfer data into register 10 during CK1 clock period $T_0$, then the enable signal EN' is asserted in CK1 clock period $T_{-1}$. That is, in general, enable signal EN' is asserted during the period of clock signal CK1 that is previous to the clock cycle in which it is desired to transfer data into register 10.

The latch 52 latches the enable signal EN' responsive to rising edges of a clock signal CK2. As shown in FIG. 3, CK2 has a period identical to the period of CK1, but CK2 is phase-shifted from clock signal CK1 by 180°. Thus, referring to FIG. 3, it can be see that the latch 52 has the effect of shifting the enable signal EN' by half of a clock period T. Thus, the shifted enable signal EN_SH "straddles" the boundary between the CK1 clock period $T_{-1}$ and CK1 clock period $T_0$.

Referring again to FIG. 2, an AND device 54 receives the clock signal CK1 and the shifted enable signal EN_SH. The AND device 54 provides a gated clock signal CK_GATED in response thereto. That is, the shifted enable signal EN_SH is clocked high by the rising edge of clock signal CK1 to produce the gated clock signal CK_GATED, and the gated clock signal CK_GATED remains high while both the shifted enable signal EN_SH and the clock signal CK1 remain high.

The gated clock signal CK_GATED is provided to the register 10 for clocking data into the register 10 only upon "demand". The circuit 50 provides robust clocking for register 10 even if there is skew in the clock signals CK1 and CK2. While FIG. 2 shows the gated clock signal CK_GATED being provided directly to the register 10, it may be desirable to provide additional drive to the gated clock signal, which can be accomplished by conventional means.

It should be understood that various alternatives to the embodiments of the invention described herein may be employed in practicing the invention. For example, since only the rising edges of clock signal CK2 are employed in latching the enable signal EN', there is no requirement that the duty cycle of clock signal CK2 have any particular relationship to the duty cycle of clock signal CK1. Furthermore, there is no requirement that clock signal CK2 be precisely 180° out of phase from clock signal CK1. However, the rising edges of clock signal CK2 should not occur while clock signal CK1 is in a high state, since this would cause an unwanted glitch in the gated clock signal CK_GATED. The invention embodiments described herein have been implemented in an integrated circuit which includes a number of additional functions and features which are described in the following co-pending, commonly assigned patent applications, the disclosure of each of which is incorporated herein by reference: U.S. patent application Ser. No. 08/451,319, entitled "DISPLAY CONTROLLER CAPABLE OF ACCESSING AN EXTERNAL MEMORY FOR GRAY SCALE MODULATION DATA" (atty. docket no. NSC1-62700); U.S. patent application Ser. No. 08/451,965, entitled "SERIAL INTERFACE CAPABLE OF OPERATING IN TWO DIFFERENT SERIAL DATA TRANSFER MODES" (atty. docket no. NSC1-62800); U.S. patent application Ser. No. 08/453,076, entitled "HIGH PERFORMANCE MULTIFUNCTION DIRECT MEMORY ACCESS (DMA) CONTROLLER" (atty. docket no. NSC1-62900); U.S. patent application Ser. No. 08/452,001, entitled "OPEN DRAIN MULTI-SOURCE CLOCK GENERATOR HAVING MINIMUM PULSE WIDTH" (atty. docket no. NSC1-63000); U.S. patent application Ser. No. 08/451,503, entitled "INTEGRATED CIRCUIT WITH MULTIPLE FUNCTIONS SHARING MULTIPLE INTERNAL SIGNAL BUSES ACCORDING TO DISTRIBUTED BUS ACCESS AND CONTROL ARBITRATION" (atty. docket no. NSC1-63100); U.S. patent application Ser. No. 08/451,924, entitled "EXECUTION UNIT ARCHITECTURE TO SUPPORT x86 INSTRUCTION SET AND x86 SEGMENTED ADDRESSING" (atty. docket no. NSC1-63300); U.S. patent application Ser. No. 08/451,444, entitled "BARREL SHIFTER" (atty. docket no. NSC1-63400); U.S. patent application Ser. No. 08/451,204, entitled "BIT SEARCHING THROUGH 8, 16, OR 32-BIT OPERANDS USING A 32-BIT DATA PATH" (atty. docket no. NSC1-63500); U.S. patent application Ser. No. 08/451,195, entitled "DOUBLE PRECISION (64-BIT) SHIFT OPERATIONS USING A 32-BIT DATA PATH" (atty. docket no. NSC1-63600); U.S. patent application Ser. No. 08/451,571, entitled "METHOD FOR PERFORMING SIGNED DIVISION" (atty. docket no. NSC1-63700); U.S. patent application Ser. No. 08/452,434, entitled "METHOD FOR PERFORMING ROTATE THROUGH CARRY USING A 32-BIT BARREL SHIFTER AND COUNTER" (atty. docket no. NSC1-63800); U.S. patent application Ser. No. 08/451,434, entitled "AREA AND TIME EFFICIENT FIELD EXTRACTION CIRCUIT" (atty. docket no. NSC1-63900); U.S. patent application Ser. No. 08/451,335, entitled "NON-ARITHMETICAL CIRCULAR BUFFER CELL AVAILABILITY STATUS INDICATOR CIRCUIT" (atty. docket no. NSC1-64000); U.S. patent application Ser. No. 08/445,563, entitled "TAGGED PREFETCH AND INSTRUCTION DECODER FOR VARIABLE LENGTH INSTRUCTION SET AND METHOD OF OPERATION" (atty. docket no. NSC1-64100); U.S. patent application Ser. No. 08/450,153, entitled "PARTITIONED DECODER CIRCUIT FOR LOW POWER OPERATION" (atty. docket no. NSC1-64200); U.S. patent application Ser. No. 08/451,495, entitled "CIRCUIT FOR DESIGNATING INSTRUCTION POINTERS FOR USE BY A PROCESSOR DECODER" (atty. docket no. NSC1-64300); U.S. patent application Ser. No. 08/451,219, entitled "CIRCUIT FOR GENERATING A DEMAND-BASED GATED CLOCK" (atty. docket no. NSC1-64500); U.S. patent application Ser. No. 08/451,214, entitled "INCREMENTOR/DECREMENTOR" (atty. docket no. NSC1-64700); U.S. patent application Ser. No. 08/451,150, entitled "A PIPELINED MICROPROCESSOR THAT PIPELINES MEMORY REQUESTS TO AN EXTERNAL MEMORY" (atty. docket no. NSC1-64800); U.S. patent application Ser. No. 08/451,198, entitled "CODE BREAKPOINT DECODER" (atty. docket no. NSC1-64900); U.S. patent application Ser. No. 08/445,569, entitled "TWO TIER PREFETCH BUFFER STRUCTURE AND METHOD WITH BYPASS" (atty. docket no. NSC1-65000); U.S. patent application Ser. No. 08/445,564, entitled "INSTRUCTION LIMIT CHECK FOR MICROPROCESSOR" (atty. docket no. NSC1-65100); U.S. patent application Ser. No. 08/452,306, entitled "A PIPELINED MICROPROCESSOR THAT MAKES MEMORY REQUESTS TO A CACHE MEMORY AND AN EXTERNAL MEMORY CONTROLLER DURING THE SAME CLOCK CYCLE" (atty. docket no. NSC1-65200); U.S. patent application Ser. No. 08/569,001, entitled "APPARATUS AND METHOD FOR EFFICIENT COMPUTATION OF A 486™ MICROPROCESSOR COMPATIBLE POP INSTRUCTION" (atty. docket no. NSC1-65700); U.S. patent application Ser. No. 08/450,154, entitled "APPARATUS AND METHOD FOR EFFICIENTLY DETERMINING ADDRESSES FOR MISALIGNED DATA STORED IN MEMORY" (atty. docket no. NSC1-65800); U.S. patent application Ser. No. 08/451,742, entitled "METHOD OF IMPLEMENTING FAST 486™ MICROPROCESSOR COMPATIBLE STRING OPERATION" (atty. docket no. NSC1-65900); U.S. patent application Ser. No. 08/452,659, entitled "A PIPELINED MICROPROCESSOR THAT PREVENTS THE CACHE FROM BEING READ WHEN THE CONTENTS OF THE CACHE ARE INVALID" (atty. docket no. NSC1-66000); U.S. patent application Ser. No. 08/451,507, entitled "DRAM CONTROLLER THAT REDUCES THE TIME REQUIRED TO PROCESS MEMORY REQUESTS" (atty. docket no. NSC1-66300); U.S. patent application Ser. No. 08/451,420, entitled "INTEGRATED PRIMARY BUS AND SECONDARY BUS CONTROLLER WITH REDUCED PIN COUNT" (atty. docket no. NSC1-66400); U.S. patent application Ser. No. 08/452,365, entitled "SUPPLY AND INTERFACE CONFIGURABLE INPUT/OUTPUT BUFFER" (atty. docket no. NSC1-66500); U.S. patent application Ser. No. 08/451,744, entitled "CLOCK GENERATION CIRCUIT FOR A DISPLAY CONTROLLER HAVING A FINE TUNEABLE FRAME RATE" (atty. docket no. NSC1-66600); U.S. patent application Ser. No. 08/451,206, entitled "CONFIGURABLE POWER MANAGEMENT SCHEME" (atty. docket no. NSC1-66700); U.S. patent application Ser. No. 08/452,350, entitled "BIDIRECTIONAL PARALLEL SIGNAL INTERFACE" (atty. docket no. NSC1-67000); U.S. patent application Ser. No. 08/452,094, entitled "LIQUID CRYSTAL DISPLAY (LCD) PROTECTION CIRCUIT" (atty. docket no. NSC1-67100); U.S. patent application Ser. No. 08/450,156, entitled "DISPLAY CONTROLLER CAPABLE OF ACCESSING GRAPHICS DATA FROM A SHARED SYSTEM MEMORY" (atty. docket no. NSC1-67500); U.S. patent application Ser. No.

08/450,726, entitled "INTEGRATED CIRCUIT WITH TEST SIGNAL BUSES AND TEST CONTROL CIRCUITS" (atty. docket no. NSC1-6700); U.S. patent application Ser. No. 08/450,568, entitled "DECODE BLOCK TEST METHOD AND APPARATUS" (atty. docket no. NSC1-68000).

It is intended that the following claims define the scope of the invention and that methods and apparatus within the scope of these claims and their equivalents be covered thereby.

What is claimed is:

1. A demand-based clocking circuit for generating a demand-based gated clock signal, the clocking circuit comprising:

a latch circuit having a data output, a data input connected to receive an enable signal having an active logic state and an inactive logic state, and a clock input connected to receive a first input clock signal having periodic clock cycles wherein, in each of said clock cycles, the first input clock signal has a first logic state during a first portion of the clock cycle and transitions to a second logic state during a second portion of the clock cycle, the data output being connected to provide a shifted enable signal that transitions from the inactive logic state to the active logic state on the first transition of the first input clock signal from the first to the second logic state after the enable signal transitions from the inactive to the active logic state, and that transitions from the active to the inactive logic state on the first transition of the first input clock signal from the first to the second logic state after the enable signal transitions from the active to the inactive logic state; and a logic circuit responsive to the shifted enable signal and to a second input clock signal having periodic clock cycles wherein, in each of said clock cycles, the second input clock signal has the second logic state during a first portion of the cycle and transitions to the first logic state during a second portion of the cycle, for providing the gated clock signal such that the gated clock signal transitions from the inactive to the active logic state on the first transition of the second input clock signal from the first to the second logic state after the shifted enable signal transitions from the inactive to the active logic state, and that transitions from the active to the inactive logic state on the transition of the shifted enable signal from the active to the inactive logic state.

2. A demand-based clock circuit as in claim 1, wherein the periodic clock cycles of the first input clock signal have a same duration as the periodic clock cycles of the second input clock signal.

3. A demand-based clock circuit as in claim 2, wherein the first input clock signal is 180° out of phase from the second input clock signal.

4. A demand-based clock circuit as in claim 1, wherein the transitions of the first clock signal from the first logic state to the second logic state occur only when the second clock signal has the second logic state.

5. A demand-based clock circuit as in claim 1, wherein the latch circuit is a D-type flip flop.

* * * * *